US011114783B1

(12) United States Patent
Wang et al.

(10) Patent No.: US 11,114,783 B1
(45) Date of Patent: Sep. 7, 2021

(54) SYSTEM AND METHOD FOR INCORPORATING AN INLINE INDUCTOR INTO A CONNECTOR

(71) Applicant: Rockwell Automation Technologies, Inc., Mayfield Heights, OH (US)

(72) Inventors: Yutao Wang, Brookfield, WI (US); Wojciech Koczwara, Sosnowiec (PL); David D. Brandt, New Berlin, WI (US); Zhentian Xie, Brookfield, WI (US); Scott T. Griffiths, Port Washington, WI (US); Mark Davidsz, Oak Creek, WI (US); Chirag L. Malkan, Brookfield, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 16/936,788

(22) Filed: Jul. 23, 2020

(51) Int. Cl.
*H01R 33/09* (2006.01)
*H01R 12/62* (2011.01)
*H01R 43/01* (2006.01)
*H05K 1/16* (2006.01)
*H01R 12/67* (2011.01)

(52) U.S. Cl.
CPC ............. *H01R 12/62* (2013.01); *H01R 43/01* (2013.01); *H05K 1/165* (2013.01); *H01R 12/67* (2013.01)

(58) Field of Classification Search
CPC ........ H01R 33/09; H01R 13/26; H01R 43/24; H01R 33/94
USPC .......................... 439/619, 699, 736, 575, 662
See application file for complete search history.

(56) References Cited

U.S. PATENT DOCUMENTS

| | | | | |
|---|---|---|---|---|
| 3,079,580 A | * | 2/1963 | Paasche | H01R 13/53 439/276 |
| 3,852,516 A | * | 12/1974 | Vander Ploog | H02G 15/003 174/71 R |
| 5,181,852 A | * | 1/1993 | Dambach | H01R 29/00 439/52 |
| 5,618,184 A | * | 4/1997 | Rail | H01R 29/00 439/71 |
| 2013/0269746 A1 | * | 10/2013 | Ramsey | H01L 31/05 136/244 |

* cited by examiner

*Primary Examiner* — Phuong Chi Thi Nguyen
(74) *Attorney, Agent, or Firm* — Fletcher Yoder, P.C.

(57) ABSTRACT

A multidrop cable may include multiple nodes electrically coupled thereon. The nodes may each include a respective PCB layer and a respective connector. The connector may provide connection between the transmission lines of the multidrop cable and the PCB layer. The PCB layer may include circuitry to reduce an induced noise of the multidrop cable by adding twist to the respective signals of the transmission lines. The PCB layer may also preserve the characteristic impedance of the multidrop cable by providing inductance in series between the respective signals of the transmission lines.

16 Claims, 7 Drawing Sheets

SYSTEM AND METHOD FOR INCORPORATING AN INLINE INDUCTOR INTO A CONNECTOR

BACKGROUND

This disclosure relates generally to systems and methods for wired communication and power transmission within an industrial automation system. More particularly, embodiments of the present disclosure are directed toward reducing noise and improving signal integrity within a multidrop cable of an industrial automation system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Industrial automation systems may include automation control and monitoring systems. The automation control and monitoring systems may monitor statuses and/or receive information from a wide range of devices, such as valves, electric motors, sensors, other suitable monitoring devices, or the like. One or more components of the industrial automation control and monitoring systems, such as programming terminals, automation controllers, input/output (I/O) modules, communication networks, human-machine interface (HMI) terminals, and the like, may communicate the statuses and/or received information using wired transmission lines via a multidrop cable, which connects multiple components of the industrial automation control system. Accordingly, the components of the automation control and monitoring systems may be electrically and communicatively coupled to the respective transmission lines using connectors at nodes to provide alerts to operators to change or adjust operation of one or more components of the industrial automation system (e.g., such as adjusting operation of one or more actuators), to manage the industrial automation system, or the like.

Generally, the components may communicate information, such as different statuses, sensing data, control signals, or the like. Certain connectors are used to connect the networked components to automation control and monitoring systems of the industrial automation systems on the respective multidrop cable. However, multidrop cables may be limited in the number of nodes on the multidrop cable to maintain a desired level of signal integrity. With this in mind, it may be useful to improve methods for communication between automation control and monitoring systems and networked devices within industrial automation systems.

SUMMARY

A summary of certain embodiments disclosed herein is set forth below. It should be understood that these aspects are presented merely to provide the reader with a brief summary of these certain embodiments and that these aspects are not intended to limit the scope of this present disclosure. Indeed, this present disclosure may encompass a variety of aspects that may not be set forth below.

In one embodiment, a multi-drop cable may communicatively couple a plurality of industrial automation components. The multi-drop cable may include a plurality of transmission lines extending between a plurality of nodes. An electrical connector may be disposed at a first node of the plurality of nodes. The electrical connector may include a printed circuit board (PCB) layer and one or more pins that may connect to one or more respective transmission lines. For example, a first pin may electrically couple a first transmission line of the plurality of transmission lines, and a second pin may electrically couple to a second transmission line of the plurality of transmission lines. The first pin and the second pin may electrically couple to one another via the electrical connector. In some embodiments, the electrical connector may transpose a first signal from the first transmission line to the second transmission line using the first and the second pins.

In some embodiments, the electrical connector may include a third pin and a fourth pin. The third pin may electrically couple a third transmission line and the fourth pin may electrically couple a fourth transmission line of the plurality of transmission lines. The third pin and the fourth pin may electrically couple to one another via the electrical connector. In some embodiments, the electrical connector may transpose a second signal from the third transmission line to the fourth transmission line using the third and the fourth pins.

In another embodiment, a method of assembling an electrical connector is described. The method of assembly includes providing a printed circuit board (PCB) layer and coupling a first input pin to the PCB layer such that the first input pin may electrically couple to a first transmission line. The method further includes coupling a first output pin to the PCB layer such that the first output pin may couple to a second transmission line, and the first input pin and the first output pin may electrically couple to one another for a first signal from the first transmission line to transpose to the second transmission line. Moreover, coupling a second input pin to the PCB layer such that the second input pin may electrically couple to the second transmission line. Furthermore, coupling a second output pin to the PCB layer such that the second output pin may couple to the first transmission line and the second input pin and the second output pin may electrically couple to one another for a second signal from the second transmission line to transpose to the first transmission line.

In yet another embodiment, an electrical connector may include a printed circuit board (PCB) layer, a first input pin electrically coupled a first transmission line of a plurality of transmission lines, a first output pin electrically coupled to a second transmission line of the plurality of transmission lines, wherein the first input pin and the first output pin are electrically coupled to one another such that a first signal from a first transmission line is transposed to the second transmission line, a second input pin electrically coupled to the second transmission line of the plurality of transmission lines, and a second output pin electrically coupled to the first transmission line of the plurality of transmission lines, wherein the second input pin and the second output pin are electrically coupled to one another such that a second signal from a second transmission line is transposed to the first transmission line.

DRAWINGS

These and other features, aspects, and advantages of the embodiments described in the present disclosure will become better understood when the following detailed description is read with reference to the accompanying drawings in which like characters represent like parts throughout the drawings, wherein.

DETAILED DESCRIPTION

Figure 1:
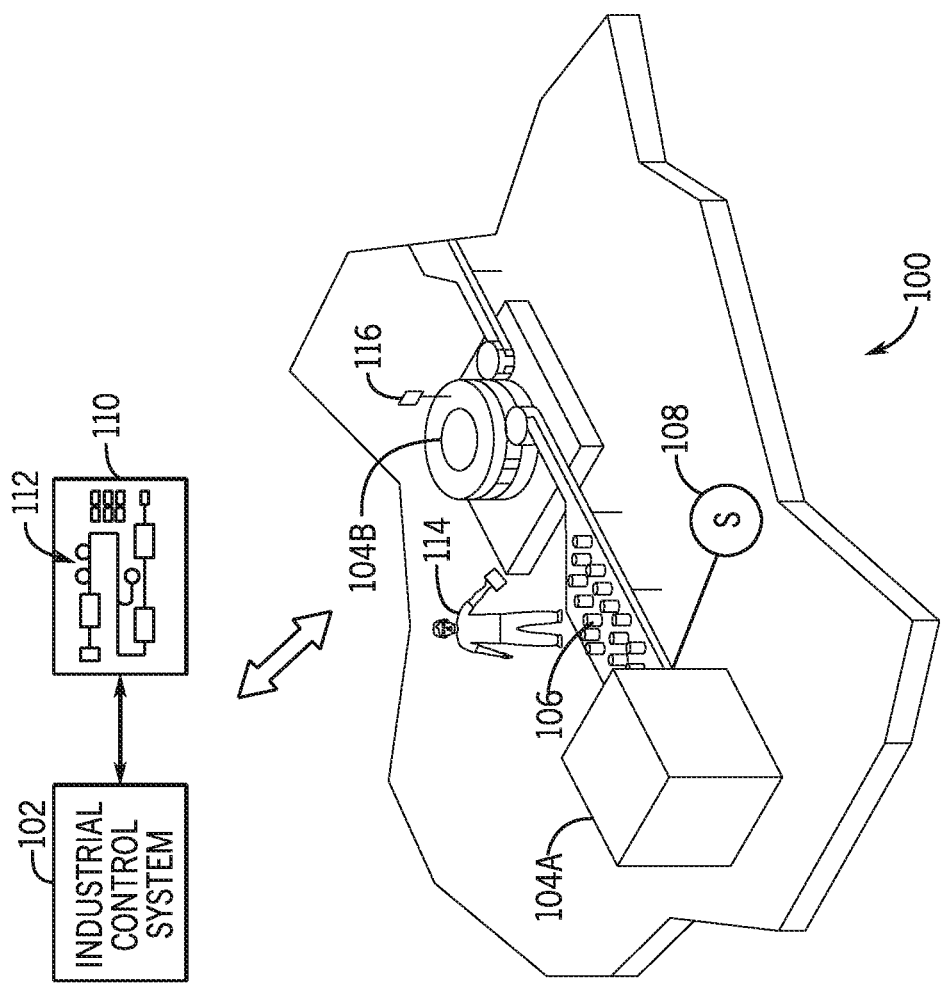
FIG. 1 is a perspective view of an example industrial automation system, in accordance with an embodiment.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present disclosure relates generally to systems and methods for improving signal integrity within transmission lines of a multidrop cable that connects multiple components of an automation control system. Transmission lines may include a plurality of differential lines (e.g., conductors) transmitting differential signals and extending between multiple nodes. For example, a transmission line may include multiple nodes connected to respective terminals of the transmission line. The conductors of the transmission lines may be disposed in a bundle, a twist, a braid, extend parallel to one another, some other configuration, or a combination of configurations, and may electrically couple the connected nodes. A transmission line with multiple nodes connected thereon may be referred to hereinafter as a multidrop cable. The term multidrop cable, as used herein, is intended to mean one or more cables, each having one or more connectors for providing power and/or communication for one or more industrial automation components. For example, the multidrop cable may be spliced into more than one cables. In some embodiments, a single cable may have multiple connectors (two connectors, three connectors, four connectors, five connectors, etc.), each having a respective node, and communicatively coupling multiple respective components of an automation control system. For example, multiple components of an automation control system may be communicatively coupled to one another via a series of cables that connect the various components of the automation control system to one another. The multiple connected components of the automation control system may be disposed in a single cabinet, spread across multiple cabinets, not in a cabinet at all, or some combination thereof. For example, a node may receive a signal from the multidrop cable or output a signal to the multidrop cable in specific times or upon a functional call. The multidrop cable may have a characteristic impedance. The characteristic impedance is proportional to a square root of a total inductance of the multidrop cable and is inversely proportional to a square root of a total capacitance of the multidrop cable as described in the formula below.

$$Z_0 = \sqrt{\frac{L}{C}}$$

Each node on the multidrop cable may have an input impedance and an output impedance. The characteristic impedance of the multidrop cable may depend on the number of connected nodes and a separation distance between the connected nodes. That is, connecting multiple nodes in proximity may cause a change of characteristic impedance in the respective proximity area of the connected nodes on the multidrop cable. The change of characteristic impedance may cause an impedance mismatch between one or more connected nodes and the multidrop cable, and may increase a signal return loss and transmission reflections of the multi drop cable.

For example, a node may include a respective shunt capacitance when connected to the multidrop cable. As such, a connected node may increase the total capacitance of the multidrop cable in a connection proximity area on the multidrop cable. A measure of the connection proximity area between the connected nodes may include the number of connected nodes with a certain separation distance between the connected nodes. Further, the total capacitance of the multidrop cable in a respective connection proximity area may include the respective capacitances of individual nodes. As such, connecting an additional node to the respective connection proximity area of the multidrop cable may increase the total capacitance of the multidrop cable and decrease the characteristic impedance of the multidrop cable in the respective connection proximity area.

Correspondingly, disconnecting a node from the respective connection proximity area of the multidrop cable reduces the total capacitance of the multidrop cable and increases the characteristic impedance of the multidrop cable in the respective connection proximity area. Thus, connecting or disconnecting a node of the multidrop cable can disrupt the signal and/or cause signal return loss. As such, increasing the number of nodes connected to a multidrop cable may increase signal return loss within the multidrop cable. For example, a number of networked components may communicate with automation control and monitoring systems via a respective connector by way of a respective transmission line on a multidrop cable. Depending on the separation distance between the connected nodes, each node on the cable may add capacitance to the system at the point of connection, thereby causing a reduction in impedance and a decrease in signal integrity as it passes each node. Furthermore, the reduction in impedance may cause mismatch between the characteristic impedance of the connected nodes and the multidrop cable and may lead to signal reflections.

Some solutions to balance the characteristic impedance of a transmission line may involve adding inline discrete inductors. Adding inductance using inline inductors may have particular benefits and drawbacks. For example, added inductance may offset the capacitance of nodes to prevent a drop in the characteristic impedance of the transmission line and increase signal integrity. However, the discrete inductors may be expensive, include high direct current resistance, and have a relatively wide tolerance range, making it difficult to achieve symmetry between differential signals. For example, inline inductors with wide tolerance range in opposite tolerance corners may turn a common-mode noise into a differential noise, which may reduce signal integrity in the differential lines of the multidrop cable. For example, a signal mode conversion of a relatively asymmetrical differential signal to common-mode signal may result in signal dissipation and loss of data, power, or both.

With the foregoing in mind, in certain embodiments of the present disclosure, twisting the conductors of the differential lines of a multidrop cable may also increase signal integrity of differential signals. That is, twisting the conductors of the differential lines may cause a noise signal to effect both conductors approximately equally. As with adding inductance using inline inductors, twisting the differential lines to improve signal integrity may have particular benefits and drawbacks. For example, while twisting the conductors of the differential lines of the multidrop cable may improve signal integrity, doing so may be inconvenient in some applications and may cause disruption in signal symmetry of differential signals. In some examples, while twisting a pair of conductors of differential lines may increase the signal integrity, twisting conductors may also disrupt power transmission of the conductors. In some other examples, an industrial automation system may require a flat multidrop cable while maintaining the signal integrity of differential lines to enable connection with certain connectors. In these applications, tap circuitry may be used. In some examples, a tap circuitry may take the form of a planar node that may connect to one or more of the transmission lines of the flat multidrop cable. In some embodiments, the tap circuitry may include a printed circuit board (PCB) layer. The tap circuitry may be configured to couple to the conductors of the multidrop cable and may include circuitry or traces that may twist the conductors of the multidrop cable on the PCB layer. The tap circuitry may also include circuitry to offset a capacitance of other connected nodes. For example, the tap circuitry may include a planar inductor superimposed on the PCB layer using circular traces. Different implementation of the tap circuitry in a multidrop cable in an industrial automation system is described below with reference to FIGS. 1-6.

By way of introduction, FIG. 1 is a perspective view of an example industrial automation system 100. The industrial automation system 100 may be controlled by an industrial control system 102. In addition, the industrial automation system 100 may include one or more stations having components and/or machines to conduct a particular function within an automated process, for example, an automated assembly line. The example automated process of the industrial automation system 100 may begin at a station 104A used for loading objects, such as empty cans or bottles to be filled, into the industrial automation system 100 via a conveyor section 106. The conveyor section 106 may transport the objects to a station 104B to perform a first action, for example, washing the empty cans and/or bottles. As objects exit from the station 104B, the conveyor section 106 may transport the objects to subsequent stations 104 to continue the manufacturing or assembly process. It should be understood, however, that for other applications, the particular system, machine components, machines, stations, and/or conveyors may be different or specially adapted to the application. In addition to the equipment described above, the industrial automation system 100 may also include motors, protection devices, switchgear, compressors, and the like.

One or more properties of components of the industrial automation system 100 may be monitored and controlled by an industrial control system 102 for regulating control variables. For example, sensing devices (e.g., sensors 108) may monitor various properties of the industrial automation system 100 and generate outputs used during operation of the industrial automation system 100. Scanners, gauges, valves, flow meters, and the like may each generate sensing data during operation of the industrial automation system 100. Sensing data may include digital or analog values representative of a sensed voltage, current, pressure, moisture level, audio level, containment level, or any other suitable parameter associated with an operation of the industrial automation system 100. The sensing data may be of any suitable format, and thus may include one or more analog electrical signals, digital data signals, pulse-width-modulated data signals, or the like. Furthermore, the input/outputs between the industrial control system 102 and the sensors 108 may be communicated using a protocol. For example, an Industrial Protocol over a multidrop cable such as a multidrop Ethernet cable may be used.

The sensing data is used by the industrial control system 102 to monitor the industrial automation system 100 and determine operational adjustments to the industrial automation system 100. These adjustments may be managed via control loops communicatively coupled to one or more sensors 108 and/or one or more industrial automation components (e.g., actuators, heating elements, etc.) via transmission lines. For example, a control loop may include a control system coupled to a motor drive, where the control system may adjust operations of the motor drive based on sensing data received from the one or more sensors 108. The industrial control system 102 may be communicatively coupled to a display/operator interface 110 (e.g., a human/machine interface (HMI)) and to one or more devices of the industrial automation system 100. The industrial control system 102 may represent components of the industrial automation system 100 through visualizations 112 of the components on the display/operator interface 110.

The sensors 108 may be any device adapted to provide information regarding process conditions. An operator 114 monitoring the industrial automation system 100 may reference the display/operator interface 110 to determine various statuses, states, and/or current operations or when adjusting operations of the industrial automation system 100 and/or for a particular component.

The industrial control system 102 may use networked devices 116 in managing operation of the industrial control system 102. The networked devices 116 may be any suitable device within the industrial automation system 100 that communicates a status, a data packet, an alert, or the like, to the industrial control system 102 and/or to other networked devices 116. The networked devices 116 may each include processing circuitry coupled to a sensor 108 that enables transmission of sensing data (e.g., sensed data) to the industrial control system 102.

Moreover, the networked devices 116 may be communicatively coupled by a multidrop cable for managing operation of the industrial control system 102. In some embodiments, the industrial automation system 100 may use one or multiple differential lines in the multidrop cable. The communications between the industrial control system 102 and different industrial components, such as the sensors 108, the display/operator interface 110, or the networked devices 116 may require a high signal integrity to prevent loss of data and erroneous adjustment of operations. Systems and methods for reliable data communication and power transmission between the described components of an industrial automation system 100 are described below with respect to multidrop cables.

Figure 2:
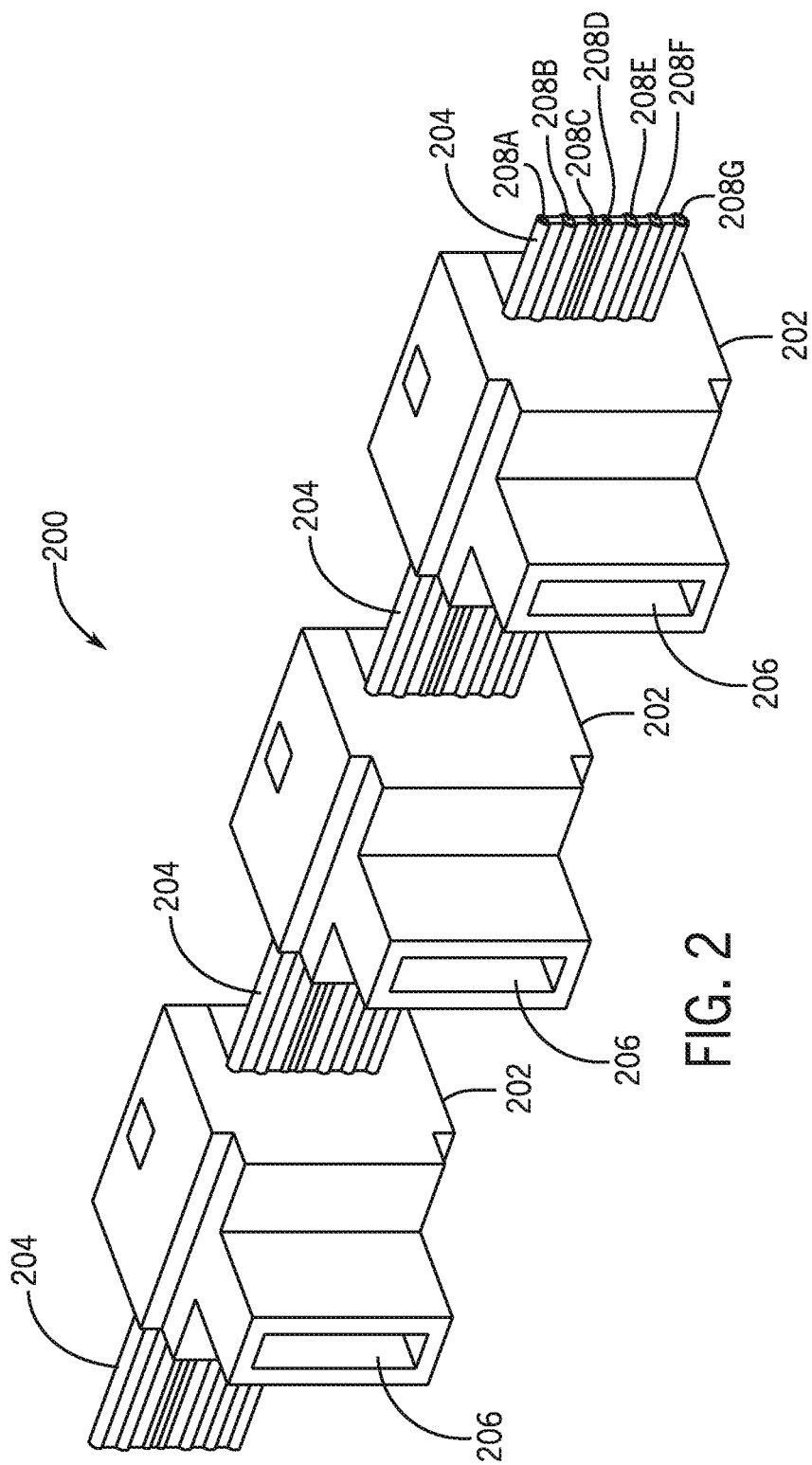
FIG. 2 is a perspective view of a portion of a multidrop cable of the industrial automation system of FIG. 1, in accordance with an embodiment.

Referring now to FIG. 2, a portion of the multidrop cable 200 is depicted for use within the industrial automation system 100 of FIG. 1. The illustrated portion of the multidrop cable 200 may include one or more terminals 202 positioned along transmission lines 204. The terminal 202 may include a slot 206 to facilitate electrical connection of an industrial automation device via a tap circuitry (not shown) to the transmission lines 204. A node may include the terminal 202 and a respective connected tap circuitry. Moreover, the transmission lines 204 may include electrical conductors 208A-208G. It should be noted that different number of terminals 202 may be used in different embodiments with the multidrop cable 200 in the industrial automation system 100.

The multidrop cable 200 may facilitate communication between the nodes using various communication protocols. Hence, the number of conductors of transmission lines 204 and the arrangement of the conductors may vary based on the communication protocol being used by the industrial automation system 100. For example, the multidrop cable 200 may use an industrial Ethernet network protocol (EtherNet/IP). The terminal 202 may each include respective tap circuitry that may facilitate connection of various industrial automation components to the transmission lines 204 of the multidrop cable 200. The connectors may facilitate power transmission and/or communication between the input/output signals of the respective node and the transmission lines 204 of the multidrop cable 200.

The industrial automation system 100 may facilitate data communication between different numbers of nodes in different configurations and different directions using the multidrop cable 200. For example, the industrial automation system 100 may communicatively connect the industrial control system 102, the sensors 108, the display/operator interface 110, the networked devices 116, or any combination thereof, using one or multiple multidrop cables 200. Also, a node may take any shape or form as long as the connection adhere to the communication protocol of the multidrop cable 200. For example, a sensor 108 may be positioned on a tap circuitry, and the tap circuitry may connect to a slot 206 of the terminal 202 to communicate with one or multiple other nodes connected on the multidrop cable 200 through the transmission lines 204.

Figure 3:
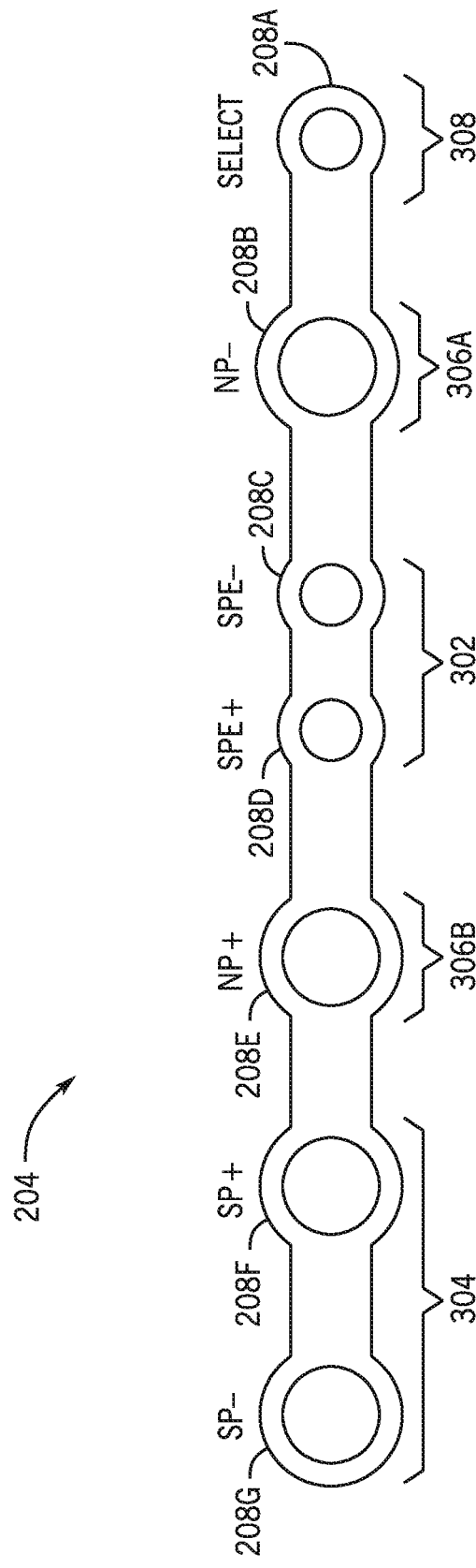
FIG. 3 is a cross-sectional view illustrating an arrangement of transmission lines within the multidrop cable of FIG. 2 using EtherNet/IP protocol.

FIG. 3 depicts a cross-sectional side view of an embodiment of the transmission lines 204 of the multidrop cable 200 using EtherNet/IP protocol. It should be noted that the multidrop cable 200 may not be restricted to the EtherNet/IP protocol or the depicted conductors 208A-208G. The multidrop cable 200 may employ other communication protocols and/or other combination of conductors in different embodiments. Also, the transmission lines 204 may include cables with different wire gauge or conductive materials for different applications.

The transmission lines 204 may include single pair Ethernet (SPE) conductors 302, a switched power (SP) 304 pair, a pair of network power (NP) conductors 306A and 306B, and a select line conductor 308. The SPE 302 may include a first and a second conductor to enable transmission of a differential signal. In certain embodiments, the SPE 302 may be a single pair Ethernet cable and the SP 304 and the NP 306A and 306B may carry Direct Current (DC) power. The SPE 302 conductors may transmit communication signals and the SP 304 conductors may transmit signals in the form of switched electrical power between different nodes. In some embodiments, the SPE 302 and/or the SP 304 may deliver electrical power to one or multiple nodes to power actuators, contactors, and sounders, among other things. The NP 306A and NP 306B conductors may provide electrical power to one or multiple nodes. In some embodiments, the NP 306A and NP 306B conductors may power the communication circuits and/or microcontrollers of the respective one or multiple nodes. Furthermore, the select line conductor 308 may communicate a select line signal to facilitate identification and configuration of nodes. The select line conductor 308 may transmit communication signals and/or facilitate communication or transmission of power signals by the SPE 302 conductors and/or the SP 304 conductors. For example, the select line conductor 308 may include identification numbers associated with selection of a node on the multidrop cable 200. It should be noted that in different examples a selected node by the select line conductor 308 may perform different functions associated with the selected node.

With the foregoing in mind, a node may communicate data with other nodes on the multi-drop cable and/or receive or provide power to other nodes on the multi-drop cable using the transmission lines 204. As the number of nodes on the multi-drop cable 200 increases, signal integrity through the transmission lines 204 of the multi-drop cable 200 decreases. Specifically, each additional node connected to the multi-drop cable may add shunt capacitance to the multi-drop cable between the differential transmission lines of the SPE 302 at the point of connection. This increase in capacitance causes a drop in impedance, and thus causing a reduction in signal integrity. That is, the increase in capacitance may cause an increased signal reflection (or return loss) due to impedance mismatch created between the connected nodes. Moreover, in some industrial applications, it may be desirable to have a signal strength above some threshold amount and/or a threshold level of signal integrity. Similarly, use of certain standards or design constraints may limit the options for the transmission lines 204 to use of specific wire gauges for data communication. For example, signal strength, transmission line heat capacity, and/or length of transmission lines 204, among other constraints, may limit the electrical current through the SPE 302 conductors and/or the SP 304 conductors. Accordingly, various design parameters may be set to maintain a level of signal integrity above a threshold value when using a given voltage.

In some embodiments, while twisting the first and the second conductors of the SPE 302 may prevent loss of a signal integrity of a respective differential signal on SPE 302, twisting the conductors may be difficult if a flat multidrop cable is used and/or the devices are positioned in relatively close proximity along the multidrop cable. For example, terminals 202 may be positioned less than a desired threshold apart along the multidrop link 200. Such constraints may prevent the use of cables with certain wire gauges or certain types of conductors, such as braids, and/or bundled cables, with certain properties. In these cases, transposing the signals using a tap circuitry may prevent the loss of signal integrity. For example, tap circuitry may clip on to a flat multidrop cable, such as the multidrop cable 200, via the terminals 202 to add twist to the respective signals of such conductors.

Figure 4A:
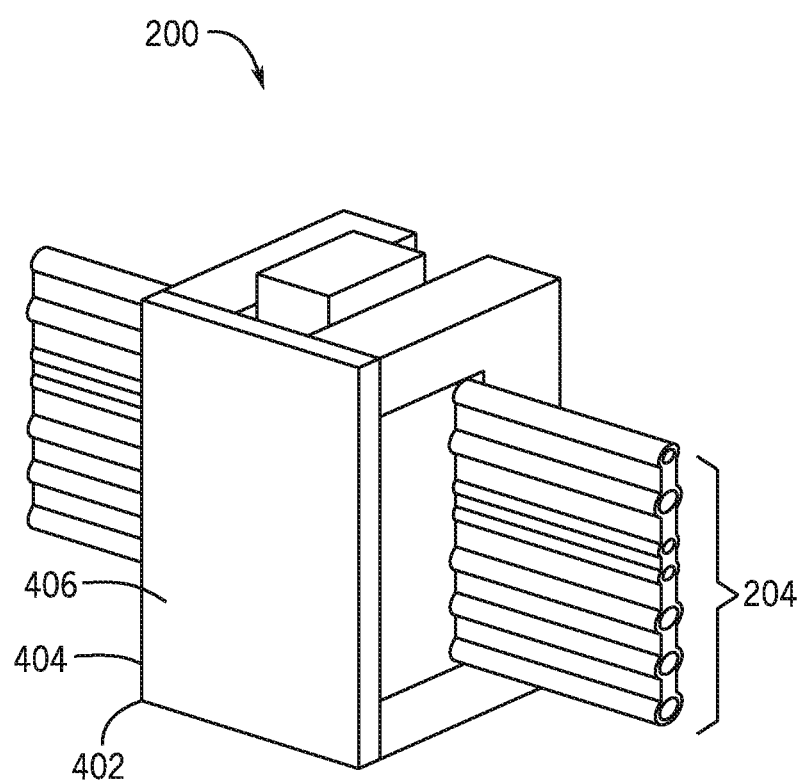
FIG. 4A is a different view of a portion of the multidrop cable of FIG. 2, in accordance with an embodiment.

FIG. 4A is a different view of the multidrop cable 200 and the transmission lines 204 including a terminal 402. For example, the terminal 402 may depict a different view of the terminal 202 of FIG. 2. The terminal 402 may include an electrical enclosure 404 for a connection between a node and the transmission lines 204 of the multidrop cable 200. For example, the electrical enclosure 404 may provide a housing for a node that may connect to the transmission lines 204 to an automation component via the terminal 402. For example, the electrical enclosure 404 may facilitate connection of tap circuitry 406 to the transmission lines 204. Each tap circuitry 406 may connect to the multidrop cable 200 via a connector. In certain embodiments, the connector may be disposed within the electrical enclosure 404. In some examples, a cabinet device may include the tap circuitry 406. In different embodiments, the terminal 402 may be different or similar to terminal 202 of FIG. 2.

In some embodiments, the tap circuitry 406 may include a PCB layer 410 and connectors. The PCB layer 410 may include circuitry to provide certain functionality to the tap circuitry 406, such as providing in-line inductance and conductive traces to twist and transpose the differential signals of a connected differential pair cable. The tap circuitry 406 may include connectors to facilitate an electrical connection between the PCB layer 410 and the transmission lines 204. In some embodiments, the connectors may include blades that cut through an insulation of the transmission lines 204 and cold-weld to the conductors 208A-208G. That is, the connectors may latch onto the conductors 208A-208G of the transmission lines 204 by cutting through the insulation covering the conductors 208A-208G. In certain embodiments, the connectors may also break the conductors and transpose differential signals using PCB layer 410.

With the foregoing in mind, certain embodiments of the connectors may include an insulation-displacement contact (IDC) connector to facilitate such connection. In these embodiments, the conductors 208A-208G of the transmission lines 204 may be positioned adjacent to one another in a flat orientation, extending parallel to one another, such as the depicted embodiment of the transmission lines 204 in FIG. 3. Such an arrangement may prevent inadvertent connection to and/or cutting of conductors by the connectors. Embodiments related to implementations of the connectors are described below with respect to FIG. 7.

Figure 4B:
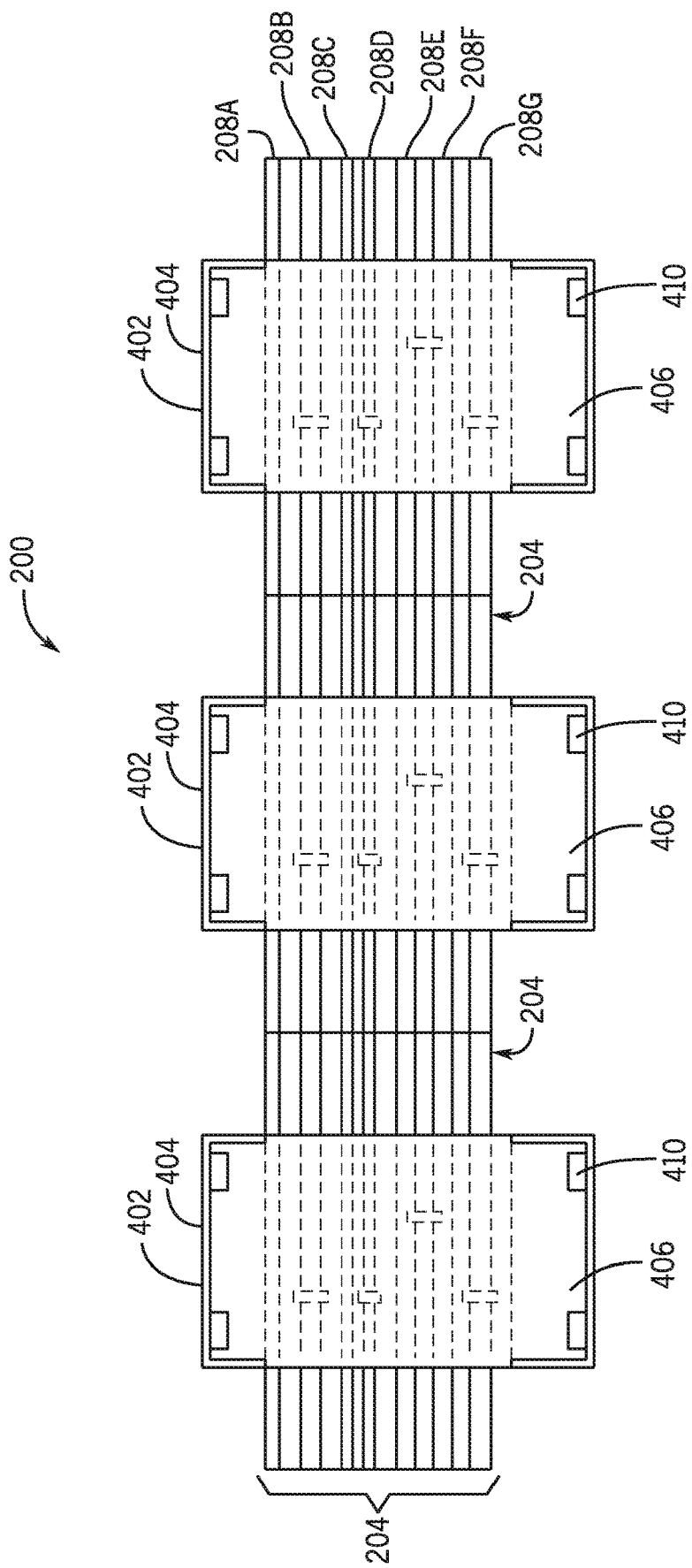
FIG. 4B is a perspective view of the portion of the multidrop cable of FIG. 2, in accordance with an embodiment.

FIG. 4B is a perspective view of the multidrop cable 200 including multiple tap circuitry 406 connected to the transmission lines 204 by the respective terminals 402 and housed within the respective electrical enclosures 404. In some embodiments, the tap circuitry 406 may each include the PCB layer 410 and connectors.

In some embodiments, the PCB layer 410 may include conductive traces and electrical components to provide certain functionality to the tap circuitry 406. For example, the PCB layer 410 may transpose the signals of conductors using conductive traces extended to a first and a second conductor of conductors 208 of the transmission lines 204. In the embodiment illustrated in FIG. 4B, the PCB layer 410 may include conductive traces to transpose a signal of the conductor 208C onto the conductor 208D and a signal of the conductor 208D onto the conductor 208C. Transposing the differential signals of the respective conductor pairs may recreate the effect of twisting the cables to maintain signal integrity of the differential signals in the presence of external interference. Multiple PCB layers 410 connected to the respective terminals 402 of the multidrop cable 200 may include twisted conductors to transpose signals, thus reducing the impact of common-mode noise on differential signals. This is described in more detail below with respect to FIG. 5.

It should be noted that in some embodiments, the planar inductors 414 may be designed with certain specification to adhere to certain requirements and/or standards. For example, in different embodiments, the PCB layer 410 may include different types of planar inductors and the respective planar inductor type may be designed with certain specification to adhere to certain requirements. It also should be noted that in certain embodiments, the PCB layer 410 may leverage the use of a discrete inductor instead of the planar inductor 414.

Figure 5:
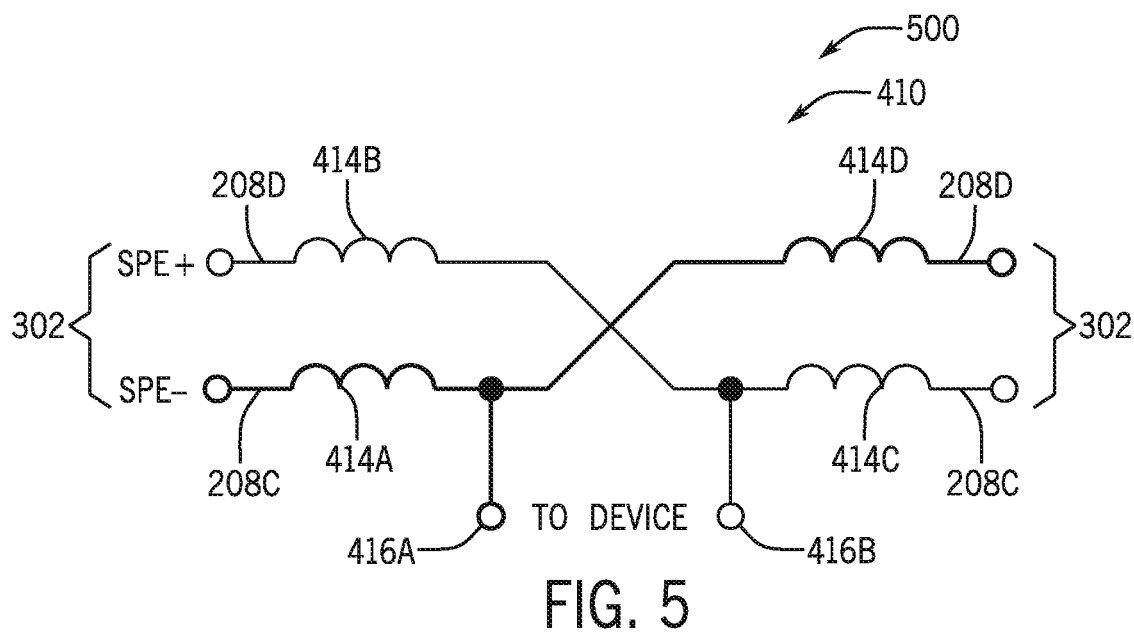
FIG. 5 is a schematic of a connector of the multidrop cable of FIG. 2, including planar inductors to provide inline inductance and twist the signals of a differential cable, in accordance with an embodiment.

FIG. 5 depicts a schematic 500 of the PCB layer 410 on a tap circuitry 406 with respect to certain embodiments of the current disclosure. The PCB layer 410 provides inline inductance and transposed (e.g., "twisted") signals transmitted by the SPE 302 on the conductors 208C and 208D. The tap circuitry 406 may be connected in series to the conductors 208C and 208D transmitting the SPE 302 signals. In some embodiments, a cabinet device may include the tap circuitry 406. Further, the tap circuitry 406 may include the connectors (e.g., pins). The connectors may use certain cutting elements to cut, break, and latch onto the conductors 208C and 208D.

The PCB layer 410 may also include traces resembling a planar inductor 414, enabling the PCB layer 410 to provide inline inductance to a signal of a conductor using conductive traces extending to the conductor via a connector. For example, the planar inductor 414 may include a circular trace transposed onto multiple sublayers of the PCB layer 410. Moreover, the planar inductor 414 may be connected in series or inline with a respective conductor of the conductors 208 by a respective connector of the connectors. That is, the planar inductor 414 may be extended between an input and an output connector of the connectors. Furthermore, the planar inductor 414 may offset a capacitance imposed by other connected nodes to the multidrop cable 200, as discussed above. Embodiments related to physical implementations of the planar inductor 414 are described in more detail below with respect to FIGS. 6 and 7.

In some embodiments, a tap circuitry 406 may transpose a signal of a first conductor onto a second conductor of the conductors 208 and include an inline planar inductor 414 between the first and the second conductors. In certain embodiments, a tap circuitry 406 may twist differential lines of the multidrop cable 200, such as the SPE 302. In such embodiments, the tap circuitry 406 may include a first planar inductor 414A inline with the first conductor, and a second planar inductor 414B inline with the second conductor of differential lines, such as the SPE 302 and the SP 304, or both of such differential lines of the multidrop cable 200. By transposing signals, the tap circuitry 406 may prevent loss of signal integrity of the respective signals of the multidrop cable 200 by reducing effects of common-mode noises.

The PCB layer 410 may include circuitry to transpose or twist the signals transmitted by the conductors and provide inline inductance to the signals. Accordingly, the PCB layer 410 may include the first planar inductor 414A connected inline with the conductor 208C, the second planar inductor 414B connected inline with the conductor 208D. In certain embodiments, the PCB layer 410 may also include a third planar inductor 414C connected inline with the conductor 208C and a fourth planar inductor 414D connected inline with the conductor 208D. The third planar inductor 414C and the fourth planar inductor 414D may be positioned on an opposite side of twisting portion of the PCB layer 410. As shown, the PCB layer 410 may transpose the signal of the conductor 208C onto the conductor 208D and transpose the signal of the conductor 208D onto the conductor 208C. As such, the PCB layer 410 may prevent loss of signal integrity by twisting the differential signals of the respective conductors. In some examples, additional circuitry may couple connectors 416A and 416B to electrically connect to the conductors 208C and 208B.

In some embodiments, the PCB layer 410 may include additional circuitry to twist the signals of other differential lines of the transmission lines 204 and provide inline inductance to the respective signals transmitted by such conductors. For example, the additional circuitry may include a third planar inductor and a fourth planar inductor inline with the respective conductors. That is, the tap circuitry 406 may include four planar inductors for connecting to four respective conductors of the transmission lines 204, and provide inline inductance when connected to the respective conductors. In different embodiments, the respective differential signals of the respective conductors may or may not be twisted.

Figures 6A, 6B:
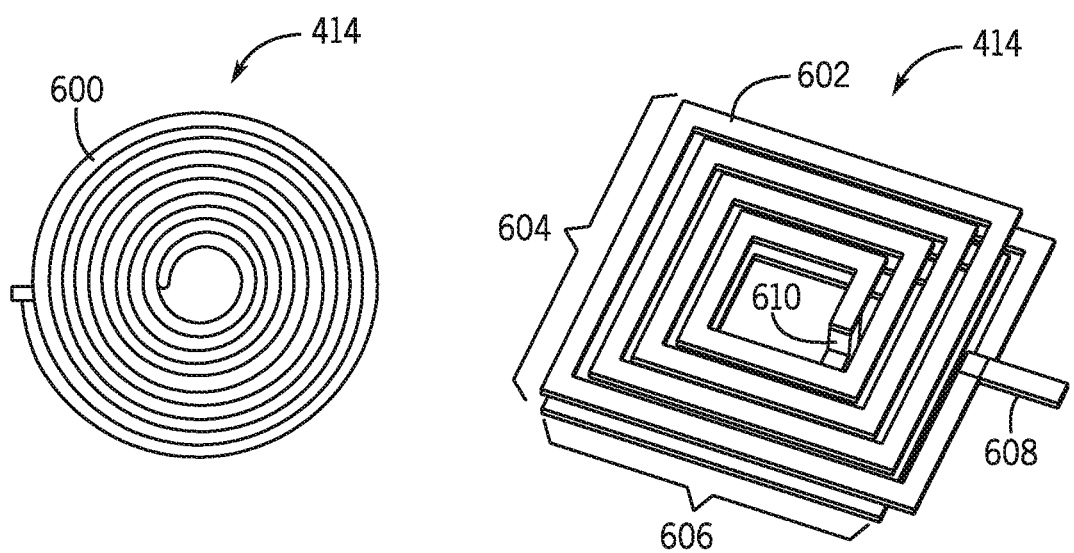
FIG. 6A is a circular conductor of a planar inductor that may be used with the PCB layer of FIG. 5, in accordance with an embodiment.
FIG. 6B is a square conductor of a planar inductor that may be used with the PCB layer of FIG. 5, in accordance with an embodiment.

Referring now to FIG. 6A, in some embodiments, the planar inductor 414 may include a circular conductor 600. The circular conductor 600 may include one layer or multiple layers transposed onto the PCB layer 410. The circular conductor 600 may connect on a first side to a first conductor and may connect on a second side to a second conductor. As such, the circular conductor 600 may provide inline inductance and transpose a signal of the first conductor onto the second conductor. For example, the planar inductor 414A of FIG. 5 may include the circular conductor 600 to connect to the conductor 208C on the first side and to the conductor 208D on the second side.

The circular conductor 600 may be designed to adhere to certain specifications and/or standards and provide a specific inductance in series to a respective conductor. For example, the circular conductor 600 may have a specific conductor diameter, a specific inductor diameter, a specified amount of spacing between layers, a specified number of turns, or other specified features. Accordingly, the circular conductor 600 may offset a capacitance on the multidrop cable 200 and prevent reduction of the characteristic impedance on the multidrop cable 200.

Referring now to FIG. 6B, in some other embodiments, the planar inductor 414 may include a square conductor 602. The square conductor 602 may also include one or multiple layers transposed onto the PCB layer 410. The square conductor 602 may connect to a first conductor on a first side and may connect to a second conductor on a second side. As such, the square conductor 602 may provide inline inductance and transpose a signal transmitted by the first conductor onto the second conductor.

In certain embodiments, the square conductor may include a first layer 604 and a second layer 606. Accordingly, the square conductor 602 may connect to a first conductor via a first conductive trace 608 and may connect to a second conductor via a second conductive trace 610. For example, the first conductive trace 608 may connect to the conductor 208C and the second conductive trace 610 may connect to the conductor 208D.

Furthermore, the square conductor 602 may be designed to adhere to certain specifications and/or standards and provide an inductance in series with a conductor. For example, the square conductor 602 may include a specific length, a specific width, a specific height, a specified spacing between layers, a specified number of turns, or other specified features. Accordingly, the square conductor 602 may offset a capacitance on the multidrop cable 200 and prevent reduction of the characteristic impedance on the multidrop cable 200.

It should be noted that the circular conductor 600 and the square conductor 602 are merely example of envisaged embodiments of the planar inductor 414 implementation. As such, the planar inductor 414 may use other implementations to provide inline inductance to the connected conductors.

Figure 7:
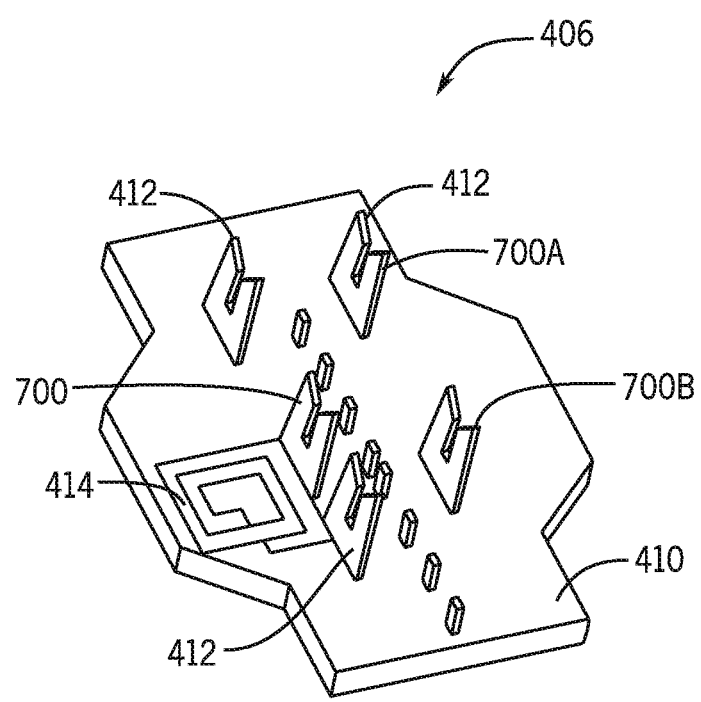
FIG. 7 is a tap circuitry including the PCB layer of FIG. 5, connectors, and a planar inductor, in accordance with an embodiment.

FIG. 7 depicts an embodiment of the tap circuitry 406, including the PCB layer 410, connectors 700 (e.g., pins), and the planar inductor 414. The connectors 700 and the planar inductor 414 may be disposed on the PCB layer 410. The connectors 700 may include blades that may cut through insulators covering conductors of transmission lines 204 and cold-weld to the conductors. For example, the planar inductor 414 may provide inductance in series between an input connector 700A and an output connector 700B. Moreover, the planar inductor 414 may connect to a first and a second conductor to transpose the signals of a differential signal. It should be noted that the tap circuitry 406 may take different shapes and include different arrangement of PCB layer 410, connectors 700, and planar inductor 414 in other embodiments related to this disclosure.

The disclosed techniques may provide enhanced signal integrity in transmission of differential electrical signals through differential cables. The described solutions may prevent an increase signal return loss by maintaining the characteristic impedance of the transmission line and include solutions to prevent signal integrity loss of differential signals. The described tap circuitry 406 and the respective conductors may facilitate differential signal transmission by disposing in-line inductors and twisting the signals of a differential pair cable to maintain signal integrity, while maintaining a desired spacing between the respective conductors and providing more design flexibility. That is, the described components and methods may introduce a technical solution to a technical problem.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A multi-drop cable for communicatively coupling a plurality of industrial automation components, the multi-drop cable comprising:
 a first transmission line and a second transmission line, wherein the first and second transmission lines are associated with a first pair of differential transmission lines; and an electrical connector, wherein the electrical connector comprises: a printed circuit board (PCB) layer;
a first input pin configured to electrically couple to the first transmission line;
a first output pin configured to electrically couple to the second transmission line, wherein the first input pin is configured to electrically couple to the first output pin such that a first signal from the first transmission line is transposed to the second transmission line;
a second input pin configured to electrically couple to the second transmission line; and
a second output pin configured to electrically couple to the first transmission line, wherein the second input pin is configured to electrically couple to the second output pin such that a second signal from the second transmission line is transposed to the first transmission line;
wherein the PCB layer comprises a first inductor configured to electrically couple between the first input pin and the first output pin;
wherein the first inductor is planar and comprises a conductor disposed in a spiral shape.

2. The multi-drop cable of claim 1, wherein the first inductor comprises a plurality of layers.

3. The multi-drop cable of claim 1, wherein the spiral shape is generally circular.

4. The multi-drop cable of claim 1, wherein the spiral shape is generally square or rectangles.

5. The multi-drop cable of claim 1, comprising a second inductor electrically coupled between the second input pin and the second output pin.

6. The multi-drop cable of claim 1, wherein each of the first input pin, the first output pin, the second input pin, and the second output pin is configured to pierce a layer of insulation surrounding a respective transmission line and electrically couple to the respective transmission line.

7. The multi-drop cable of claim 1, wherein the electrical connector comprises a blade configured to cut through an insulation layer of the first transmission line and the second transmission line.

8. The multi-drop cable of claim 1, comprising:
a second electrical connector, the second electrical connector comprising: a second printed circuit board (PCB) layer; a third input pin configured to electrically couple the first transmission line;
a third output pin electrically coupled to the second transmission line, wherein the third input pin and the third output pin are electrically coupled to one another such that the first signal from the first transmission line is transposed to the second transmission line;
a fourth input pin electrically coupled to the second transmission line; and a fourth output pin electrically coupled to the first transmission line of the plurality of transmission lines, wherein the fourth input pin and the fourth output pin are electrically coupled to one another such that the second signal from the second transmission line is transposed to the first transmission line.

9. The multi-drop cable of claim 1, wherein each of the first input pin, the first output pin, the second input pin, and the second output pin is configured to electrically couple a respective in-line inductor.

10. The multi-drop cable of claim 9, wherein the respective in-line inductors are planar.

11. A method of assembling an electrical connector, comprising: providing a printed circuit board (PCB) layer;
coupling a first input pin to the PCB layer, wherein the first input pin is configured to electrically couple to a first transmission line of a first pair of transmission lines;
coupling a first output pin to the PCB layer, wherein the first output pin is configured to couple to a second transmission line of the first pair of transmission lines, wherein the first input pin and the first output pin are electrically coupled to one another such that a first signal from the first transmission line is transposed to the second transmission line;
coupling a second input pin to the PCB layer, wherein the second input pin is configured to electrically coupled to the second transmission line of the first pair of transmission lines; and
coupling a second output pin to the PCB layer, wherein the second output pin is configured to couple to the first transmission line of the first pair of transmission lines, wherein the second input pin and the second output pin are electrically coupled to one another such that a second signal from the second transmission line is transposed to the first transmission line;
providing a first inductor on the PCB layer in series between the first input pin and the first output pin;
wherein the first inductor is at least partially provided via a first planar inductor comprising a conductor disposed in a spiral shape.

12. The method of assembling an electrical connector of claim 11, comprising providing a second inductor on the PCB layer in series between the second input pin and the second output pin, wherein the second inductor is at least partially provided via a second planar inductor comprising a conductor disposed in a spiral shape.

13. An electrical connector comprising: a printed circuit board (PCB) layer;
a first pair of differential transmission lines;
a first input pin electrically coupled a first transmission line of the first differential transmission lines;
a first output pin electrically coupled to a second transmission line of the first differential transmission lines, wherein the first input pin and the first output pin are electrically coupled to one another such that a first signal from the first transmission line is transposed to the second transmission line;
a second input pin electrically coupled to the second transmission line of the differential transmission lines; and
a second output pin electrically coupled to the first transmission line of the first differential transmission lines, wherein the second input pin and the second output pin are electrically coupled to one another such that a second signal from the second transmission line is transposed to the first transmission line;
providing a first inductor on the PCB layer in series between the first input pin and the first output pin;
wherein the first inductor is at least partially provided via a first planar inductor comprising a conductor disposed in a spiral shape.

14. The electrical connector of claim 13, wherein the PCB layer comprises a first planar inductor electrically coupled to the first input pin, and wherein the PCB layer comprises a second planar inductor electrically coupled to the first output pin.

15. The electrical connector of claim 14, wherein the PCB layer comprises a third planar inductor electrically coupled to the second input pin, and wherein the PCB layer comprises a fourth planar inductor electrically coupled to the second output pin.

16. The electrical connector of claim 14, wherein the first planar inductor and the second planar inductor are configured to electrically couple, and the third planar inductor and the fourth planar inductor are configured to electrically couple.

\* \* \* \* \*